United States Patent
An et al.

(10) Patent No.: US 12,253,572 B2
(45) Date of Patent: Mar. 18, 2025

(54) BATTERY DIAGNOSING APPARATUS AND METHOD

(71) Applicant: LG Energy Solution, Ltd., Seoul (KR)

(72) Inventors: Yang-Soo An, Daejeon (KR); Yong-Chul Sung, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 136 days.

(21) Appl. No.: 18/005,272

(22) PCT Filed: Dec. 28, 2021

(86) PCT No.: PCT/KR2021/020090
§ 371 (c)(1),
(2) Date: Jan. 12, 2023

(87) PCT Pub. No.: WO2022/145998
PCT Pub. Date: Jul. 7, 2022

(65) Prior Publication Data
US 2023/0258735 A1    Aug. 17, 2023

(30) Foreign Application Priority Data
Dec. 28, 2020 (KR) .......................... 10-2020-0184947

(51) Int. Cl.
*G01R 31/396* (2019.01)
*G01R 31/3835* (2019.01)

(52) U.S. Cl.
CPC ....... *G01R 31/396* (2019.01); *G01R 31/3835* (2019.01)

(58) Field of Classification Search
None
See application file for complete search history.

(56) References Cited

U.S. PATENT DOCUMENTS

| | | |
|---|---|---|
| 6,477,024 B1 | 11/2002 | Kikuchi et al. |
| 7,332,891 B2 | 2/2008 | Sugimoto |

(Continued)

FOREIGN PATENT DOCUMENTS

| | | |
|---|---|---|
| JP | 200431120 A | 1/2004 |
| JP | 4030217 B2 | 1/2008 |

(Continued)

OTHER PUBLICATIONS

Extended European Search Report including Written Opinion for Application No. 21915796.3 dated Mar. 14, 2024, pp. 1-8.

(Continued)

*Primary Examiner* — Jas A Sanghera
(74) *Attorney, Agent, or Firm* — Lerner David LLP

(57) ABSTRACT

A battery diagnosing apparatus includes a voltage measuring unit configured to measure a voltage of each of a plurality of battery cells included in a battery module at every voltage measurement cycled and a control unit configured to obtain a voltage value for the plurality of battery cells from the voltage measuring unit at every voltage measurement cycle, calculate a voltage change amount between the plurality of obtained voltage values for the plurality of battery cells, calculate a voltage change rate between the plurality of calculated voltage change amounts at every diagnosis cycle different from the voltage measurement cycle, and diagnose the battery module based on one or more voltage change rates calculated up to a current diagnosis cycle and a preset criterion change rate.

12 Claims, 4 Drawing Sheets

(56) References Cited

U.S. PATENT DOCUMENTS

| | | | |
|---|---|---|---|
| 2004/0001996 A1 | 1/2004 | Sugimoto | |
| 2010/0066379 A1 | 3/2010 | Iida | |
| 2011/0037476 A1 | 2/2011 | Jung et al. | |
| 2012/0004873 A1* | 1/2012 | Li | G01R 31/36 320/134 |
| 2013/0049698 A1 | 2/2013 | Jung | |
| 2013/0314095 A1* | 11/2013 | Nakashima | G01R 31/382 324/433 |
| 2020/0408846 A1 | 12/2020 | Bae et al. | |
| 2021/0104782 A1 | 4/2021 | Park et al. | |
| 2021/0218262 A1 | 7/2021 | Bae et al. | |
| 2021/0325476 A1 | 10/2021 | Bae et al. | |

FOREIGN PATENT DOCUMENTS

| | | |
|---|---|---|
| JP | 2008118777 A | 5/2008 |
| JP | 2012047521 A | 3/2012 |
| JP | 2013051865 A | 3/2013 |
| JP | 5466564 B2 | 4/2014 |
| JP | 2015103283 A | 6/2015 |
| JP | 2015204217 A | 11/2015 |
| JP | 2017073370 A | 4/2017 |
| JP | 2017219430 A | 12/2017 |
| JP | 6476724 B2 | 3/2019 |
| KR | 101099811 B1 | 12/2011 |
| KR | 20130024763 A | 3/2013 |
| KR | 101572650 B1 | 12/2015 |
| KR | 20190054513 A | 5/2019 |
| KR | 20190118534 A | 10/2019 |
| KR | 20200111014 A | 9/2020 |
| WO | 2020189918 A1 | 9/2020 |

OTHER PUBLICATIONS

International Search Report for PCT/KR2021/020090 mailed Apr. 19, 2022. 3 pgs.

* cited by examiner

BATTERY DIAGNOSING APPARATUS AND METHOD

CROSS-REFERENCE TO RELATED APPLICATIONS

The present application is a national phase entry under 35 U.S.C. § 371 of International Application No. PCT/KR2021/020090 filed Dec. 28, 2021, which claims priority from Korean Patent Application No. 10-2020-0184947 filed Dec. 28, 2020, all of which are incorporated herein by reference.

TECHNICAL FIELD

The present disclosure relates to a battery diagnosing apparatus and method, and more particularly, to a battery diagnosing apparatus and method capable of diagnosing a state of a battery module based on voltage behavior of a plurality of battery cells included in the battery module.

BACKGROUND ART

Recently, the demand for portable electronic products such as notebook computers, video cameras and portable telephones has increased sharply, and electric vehicles, energy storage batteries, robots, satellites and the like have been developed in earnest. Accordingly, high-performance batteries allowing repeated charging and discharging are being actively studied.

Batteries commercially available at present include nickel-cadmium batteries, nickel hydrogen batteries, nickel-zinc batteries, lithium batteries and the like. Among them, the lithium batteries are in the limelight since they have almost no memory effect compared to nickel-based batteries and also have very low self-charging rate and high energy density.

Conventionally, the state of the battery is diagnosed in consideration of voltage, temperature and current change amounts of the battery. In particular, based on the result of comparing the voltage of the battery with a criterion value, it is monitored whether the battery has overvoltage and/or low voltage.

However, conventionally, since the state of the battery is diagnosed according to the voltage of the battery at a specific time point, the voltage fluctuation trend of the battery cannot be grasped, and it is difficult to diagnose the state of the battery according to the voltage fluctuation trend.

SUMMARY

Technical Problem

The present disclosure is designed to solve the problems of the related art, and therefore the present disclosure is directed to providing a battery diagnosing apparatus and method capable of diagnosing a state of a battery module based on voltage fluctuation trends of a plurality of battery cells.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

A battery diagnosing apparatus according to one aspect of the present disclosure may comprise: a voltage sensor configured to measure a voltage of each of a plurality of battery cells included in a battery module at each voltage measurement cycle of a plurality of diagnosis cycles, wherein each diagnosis cycle includes a respective plurality of voltage measurement cycles; a controller; and memory having instructions stored thereon and configured to cause the controller to: at each respective voltage measurement cycle, obtain measured voltages of the plurality of battery cells from the voltage sensor; at each respective diagnosis cycle, calculate a voltage change amount based on the measured voltages of the plurality of voltage measurement cycles of the respective diagnosis cycle; at each respective diagnosis cycle, calculate a voltage change rate indicating a difference between a first calculated voltage change amount of the respective diagnosis cycle and a last calculated voltage change amount of the respective diagnosis cycle; and diagnose the battery module based on one or more calculated voltage change rates and a preset threshold change rate.

The instructions may be configured to cause the controller to compare a magnitude of the voltage change rate calculated at a current diagnosis cycle and a magnitude of the threshold change rate; and determine a state of the battery module based on the comparison.

The instructions may be configured to cause the controller to at a current diagnosis cycle: determine the state of the battery module based on a reference change rate preset at a previous diagnosis cycle and the voltage change rate of the current diagnosis cycle in response to the voltage change rate of the current diagnosis cycle being equal to or greater than the threshold change rate.

The instructions may be configured to cause the controller to determine that the battery module is normal in response to the voltage change rate of the current diagnosis cycle being less than the threshold change rate.

The reference change rate may be a largest voltage change rate among one or more voltage change rates calculated at one or more diagnosis cycles previous to the current diagnosis cycle.

The instructions may be configured to cause the controller to at the current diagnosis cycle, determine that the battery module is defective in response to the voltage change rate being equal to or greater than the threshold change rate and the reference change rate.

The instructions may be configured to cause the controller to determine the state of the battery module at every diagnosis cycle; adjust a preset counting value according to the determined state of the battery module; and diagnose the battery module based on the adjusted counting value and a preset threshold value.

The instructions may be configured to cause the controller to determine that the battery module is defective in response to the adjusted counting value being equal to or greater than the threshold value.

The instructions may be configured to cause the controller to decrease the counting value in response to the voltage change rate being less than the reference change rate.

The instructions may be configured to cause the controller to increase the counting value in response to the voltage change rate being equal to or greater than the reference change rate.

The instructions may be configured to cause the controller to, for each respective diagnosis cycle, calculate the voltage change amount of the respective diagnosis cycle by computing a standard deviation or dispersion of the plurality of measured voltage values of the respective diagnosis cycle.

The diagnosis cycle may be set to be greater than the voltage measurement cycle.

The instructions may be configured to cause the controller to individually diagnose each respective battery cell of the plurality of battery cells based on the measured voltage values corresponding to the respective battery cell.

A battery pack according to another aspect of the present disclosure may comprise the battery diagnosing apparatus according to any of the embodiments described in the present disclosure.

A battery diagnosing method according to still another aspect of the present disclosure may comprise: measuring, by a voltage sensor, a voltage of each of a plurality of battery cells included in a battery module at each voltage measurement cycle of a plurality of diagnosis cycles, wherein each diagnosis cycle includes a respective plurality of voltage measurement cycles; at each respective voltage measurement cycle, obtaining, by a controller, measured voltages of the plurality of battery cells from the voltage sensor; at each respective diagnosis cycle, calculating, by a controller, a voltage change amount based on the measured voltages of the plurality of voltage measurement cycles of the respective diagnosis cycle; at each respective diagnosis cycle, calculating, by the controller, a voltage change rate indicating a difference between a first calculated voltage change amount of the respective diagnosis cycle and a last calculated voltage change amount of the respective diagnosis cycle; and diagnosing, by the controller, the battery module based on one or more calculated voltage change rates and a preset threshold change rate.

Advantageous Effects

According to an aspect of the present disclosure, the state of the battery module may be diagnosed based on the voltage behavior of a plurality of battery cells included in the battery module.

The effects of the present disclosure are not limited to the effects mentioned above, and other effects not mentioned will be clearly understood by those skilled in the art from the description of the claims.

BRIEF DESCRIPTION OF THE DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

DETAILED DESCRIPTION

It should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise.

In addition, throughout the specification, when a portion is referred to as being "connected" to another portion, it is not limited to the case that they are "directly connected", but it also includes the case where they are "indirectly connected" with another element being interposed between them.

Hereinafter, preferred embodiments of the present disclosure will be described in detail with reference to the accompanying drawings.

Figure 1:
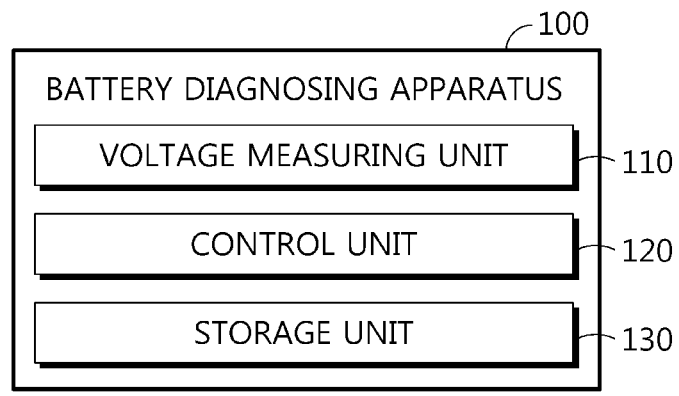
FIG. 1 is a diagram schematically showing a battery diagnosing apparatus according to an embodiment of the present disclosure.
Figure 2:
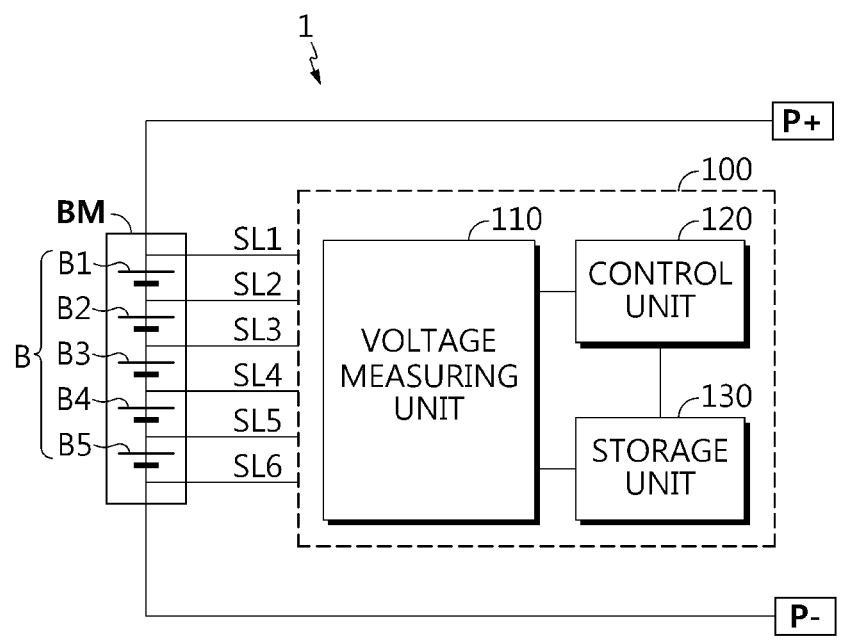
FIG. 2 is a diagram schematically showing an exemplary configuration of a battery pack according to another embodiment of the present disclosure.

FIG. 1 is a diagram schematically showing a battery diagnosing apparatus 100 according to an embodiment of the present disclosure. FIG. 2 is a diagram schematically showing an exemplary configuration of a battery pack 1 according to another embodiment of the present disclosure.

Referring to FIG. 1, the battery diagnosing apparatus 100 may include a voltage measuring unit 110 and a control unit 120.

The voltage measuring unit 110 may be configured to measure a voltage of each of a plurality of battery cells B included in a battery module BM at every voltage measurement cycle.

Here, the battery module BM may include one or more battery cells connected in series and/or in parallel. In addition, the battery cell means a physically separable one independent cell having a negative electrode terminal and a positive electrode terminal. For example, one pouch-type lithium polymer cell may be regarded as a battery cell.

Also, the voltage measurement cycle may be a cycle preset such that the voltage measuring unit 110 measures the voltage of each of the plurality of battery cells B. For example, the voltage measurement cycle may be 1 second.

For example, in the embodiment of FIG. 2, the battery module BM may include five battery cells B1 to B5.

Also, in the embodiment of FIG. 2, the voltage measuring unit 110 may be connected to a first sensing line SL1, a second sensing line SL2, a third sensing line SL3, a fourth sensing line SL4, a fifth sensing line SL5, and a sixth sensing line SL6. The voltage measuring unit 110 may measure the voltage of the first battery cell B1 through the first sensing line SL1 and the second sensing line SL2, and measure the voltage of the second battery cell B2 through the second sensing line SL2 and the third sensing line SL3. In addition, the voltage measuring unit 110 may measure the voltage of the third battery cell B3 through the third sensing line SL3 and the fourth sensing line SL4, measure the voltage of the fourth battery cell B4 through the fourth sensing line SL4 and the fifth sensing line SL5, and measure the voltage of the fifth battery cell B5 through the sensing line SL5 and the sixth sensing line SL6.

The control unit 120 may be configured to obtain a voltage value for the plurality of battery cells B from the voltage measuring unit 110 at every voltage measurement cycle.

For example, in the embodiment of FIG. 2, the voltage measuring unit 110 and the control unit 120 may be connected to communicate with each other. The voltage measuring unit 110 may measure the voltage of the plurality of battery cells B at every voltage measurement cycle and transmit the measured voltage value to the control unit 120. Accordingly, the control unit 120 may obtain the voltage values for the plurality of battery cells B at every voltage measurement cycle.

The control unit 120 may be configured to calculate a voltage change amount between the plurality of obtained voltage values for the plurality of battery cells B.

For example, in the embodiment of FIG. 2, the control unit 120 may calculate a voltage change amount between the voltage values of the first to fifth battery cells B1 to B5.

Specifically, the control unit 120 may be configured to calculate the voltage change amount by computing a standard deviation or dispersion between the plurality of voltage values at every voltage measurement cycle. That is, the voltage change amount calculated by the control unit 120 may be a standard deviation or dispersion of a plurality of voltage values measured at the same time point.

The control unit 120 may be configured to calculate a voltage change rate between the plurality of calculated voltage change amounts at every diagnosis cycle different from the voltage measurement cycle.

Here, the diagnosis cycle is a cycle at which the voltage change rate is calculated, and may be a cycle for diagnosing the battery module BM. Preferably, the diagnosis cycle may be set to be greater than the voltage measurement cycle. For example, the diagnosis cycle may be set to 100 seconds.

For example, as in the previous embodiment, it is assumed that the voltage measurement cycle is 1 second and the diagnosis cycle is 100 seconds. Since the control unit 120 calculates a voltage change amount for the plurality of battery cells B at every voltage measurement cycle, 100 voltage change amounts may be calculated by the control unit 120 whenever a diagnosis cycle arrives. The control unit 120 may calculate the voltage change rate for the current diagnosis cycle by computing an average change rate of 100 voltage change amounts.

Specifically, a total of 100 voltage change amounts may be calculated from the $n-1^{th}$ diagnosis cycle to the $n^{th}$ diagnosis cycle. For example, the first to the $100^{th}$ voltage change amounts may be calculated according to the voltage measurement cycle (1 second). The control unit 120 may calculate the voltage change rate for the $N^{th}$ diagnosis cycle by computing the average change rate of the first voltage change amount and the $100^{th}$ voltage change amount using Formula 1 below.

$$VRn = (Sm - S1) \div m \quad \text{[Formula 1]}$$

Here, VRn is a voltage change rate of the $n^{th}$ diagnosis cycle. m is the number of voltage change amounts calculated from the $n-1^{th}$ diagnosis cycle to the $n^{th}$ diagnosis cycle. For example, m may be calculated as "diagnosis cycle÷voltage measurement cycle". Sm is a voltage change amount calculated last at the $n^{th}$ diagnosis cycle, and S1 is a voltage change amount calculated first at the $n^{th}$ diagnosis cycle.

For example, it is assumed that the diagnosis cycle is 100 seconds, the voltage measurement cycle is 1 second, and the current diagnosis cycle is the third diagnosis cycle. At the third diagnosis cycle, a total of 100 voltage change amounts may be calculated. That is, in Formula 1, m may be 100 (the calculation result of "100÷1"). Sm may be the $100^{th}$ calculated voltage change amount, and Si may be the first calculated voltage change amount. According to Formula 1, the voltage change rate (VR3) of the third diagnosis cycle may be calculated according to the formula of "(S100−S1) ÷100".

The control unit 120 may be configured to diagnose the battery module BM based on one or more voltage change rates calculated up to the current diagnosis cycle and a preset criterion change rate.

Here, the criterion change rate may be a voltage change rate that is a criterion for diagnosing the battery module BM as a defective state or a normal state. Preferably, the criterion change rate may be set to correspond to the battery module BM in a BOL (Beginning of Life) state. Here, the battery module BM in the BOL state means a battery module BM including one or more battery cells in the BOL state.

For example, the control unit 120 may be configured to compare the magnitudes of the voltage change rate calculated in the current diagnosis cycle and the criterion change rate and diagnose the battery module BM according to the comparison result.

The battery diagnosing apparatus 100 according to an embodiment of the present disclosure may periodically calculate a voltage change rate of the voltage change amount for the plurality of battery cells B. That is, the average change rate for the voltage distribution of the plurality of battery cells B included in the battery module BM may be calculated at each diagnosis cycle. In addition, the battery module BM may be diagnosed based on an average change rate (average voltage change rate) for voltage distribution and the criterion change rate. Accordingly, the battery diagnosing apparatus 100 may more accurately diagnose the state of the battery module BM by considering the voltage behavior of the plurality of battery cells B during the diagnosis cycle.

Meanwhile, the control unit 120 provided to the battery diagnosing apparatus 100 may optionally include a processor, an application-specific integrated circuit (ASIC), another chipset, a logic circuit, a register, a communication modem, and a data processing device, and the like, known in the art to execute various control logics performed in the present disclosure. In addition, when the control logic is implemented in software, the control unit 120 may be implemented as a set of program modules. At this time, the program module may be stored in a memory and executed by the control unit 120. The memory may be provided in or out of the control unit 120, and may be connected to the control unit 120 by various well-known means.

In addition, the battery diagnosing apparatus 100 may further include a storage unit 130. The storage unit 130 may store data or programs necessary for operation and function of each component of the battery diagnosing apparatus 100, data generated in the process of performing the operation or function, or the like. The storage unit 130 is not particularly limited in its kind as long as it is a known information storage means that can record, erase, update and read data. As an example, the information storage means may include random access memory (RAM), flash memory, read-only memory (ROM), electrically erasable programmable read-only memory (EEPROM), registers, and the like. In addition, the storage unit 130 may store program codes in which processes executable by the control unit 120 are defined.

For example, the voltages of the plurality of battery cells B measured by the voltage measuring unit 110 at every voltage measurement cycle and the voltage change amount calculated by the control unit 120 may be stored in the storage unit 130. In addition, the criterion change rate for the battery module BM in the BOL state may also be stored in advance in the storage unit 130. The control unit 120 may access the storage unit 130 to obtain the plurality of voltage change amounts calculated during the diagnosis cycle and obtain the preset criterion change rate.

Hereinafter, an embodiment in which the control unit 120 diagnoses the battery module BM will be described.

First, it is assumed that the voltage measurement cycle is 1 second, the diagnosis cycle is 100 seconds, and the current diagnosis cycle is the fifth diagnosis cycle. The first voltage change rate may be calculated for the first diagnosis cycle (1 sec to 100 sec), and the second voltage change rate may be calculated for the second diagnosis cycle (101 sec to 200 sec). In addition, the third voltage change rate may be calculated for the third diagnosis cycle (201 sec to 300 sec), the fourth voltage change rate may be calculated for the fourth diagnosis cycle (301 sec to 400 sec), and the fifth voltage change rate may be calculated for the fifth diagnosis cycle (401 sec to 500 sec).

The control unit 120 may be configured to compare the magnitudes of the voltage change rate calculated at the current diagnosis cycle and the criterion change rate and diagnose the battery module BM according to the comparison result.

Specifically, when the voltage change rate is less than the criterion change rate, the control unit 120 may be configured to diagnose the battery module BM as a normal module.

For example, when the fifth voltage change rate calculated at the current diagnosis cycle is less than the criterion change rate, the control unit 120 may diagnose the battery module BM as a normal module.

That is, when the voltage change rate of the plurality of battery cells B calculated at the current diagnosis cycle is less than the criterion change rate, the control unit 120 may diagnose the battery module BM as in a normal state without comparing the voltage change rate of the current diagnosis cycle with the voltage change rate of the previous diagnosis cycle.

Conversely, if the voltage change rate is greater than or equal to the criterion change rate, the control unit 120 may be configured to diagnose the battery module BM based on a reference change rate preset at a previous diagnosis cycle and the voltage change rate.

Here, the control unit 120 may be configured to preset a largest voltage change rate among one or more voltage change rates calculated at the previous diagnosis cycle as the reference change rate.

For example, it is assumed that the third voltage change rate is largest among the first to fourth voltage change rates. The control unit 120 may preset the third voltage change rate having the largest magnitude among the first to fourth voltage change rates before the fifth diagnosis cycle as the reference change rate.

The control unit 120 may be configured to diagnose the battery module BM as the normal module, when the voltage change rate is greater than or equal to the criterion change rate and less than the reference change rate.

For example, when the fifth voltage change rate is equal to or greater than the criterion change rate but less than the reference change rate (the third voltage change rate), the control unit 120 may diagnose the battery module BM as a normal module at the fifth diagnosis cycle. That is, at the fifth diagnosis cycle, when the fifth voltage change rate of the plurality of battery cells B is equal to or greater than the criterion change rate but less than the reference change rate (the third voltage change rate), the control unit 120 may judge that the change rate with respect to the voltage deviation of the plurality of battery cells B is not increased compared to the previous diagnosis cycle. Accordingly, when the voltage change rate of the current cycle is greater than or equal to the criterion change rate but less than the reference change rate, the control unit 120 may diagnose the battery module BM as a normal module.

Conversely, the control unit 120 may be configured to diagnose the battery module BM as a defective module, when the voltage change rate is equal to or greater than the criterion change rate and the reference change rate.

For example, if the voltage change rate (the fifth voltage change rate) of the current diagnosis cycle (the fifth diagnosis cycle) is equal to or greater than the criterion change rate and the reference change rate (the third voltage change rate), the control unit 120 may judge that the change rate with respect to the voltage deviation of the plurality of battery cells B is equal to or greater than the criterion change rate and is increasing compared to the previous diagnosis cycle. That is, the control unit 120 may judge that the degree of degradation is non-uniform among the plurality of battery cells B included in the battery module BM at the current cycle. Accordingly, the control unit 120 may diagnose the battery module BM as a defective module.

In summary, if the voltage change rate is less than the criterion change rate, the battery diagnosing apparatus 100 may diagnose the battery module BM as a normal module without considering the reference change rate. In addition, the battery diagnosing apparatus 100 may diagnose the battery module BM as a normal module, when the voltage change rate is greater than or equal to the criterion change rate and less than the reference change rate. Finally, the battery diagnosing apparatus 100 may diagnose the battery module BM as a defective module, when the voltage change rate is equal to or greater than the criterion change rate and the reference change rate.

That is, the battery diagnosing apparatus 100 may consider all of the voltage change rate of the current diagnosis cycle, the criterion change rate and the reference change rate in the process of diagnosing the state of the battery module BM. By comparing the voltage change rate and the criterion change rate, the current state of the battery module BM may be diagnosed in comparison to the battery module BM in the BOL state. In addition, the state of the battery module BM for non-uniform degradation of the plurality of battery cells B may be diagnosed by comparing the voltage change rate and the reference change rate. Therefore, the battery diagnosing apparatus 100 has an advantage of diagnosing the state of the battery module BM at the current diagnosis cycle in more various aspects.

Meanwhile, the control unit 120 may be configured to set the largest voltage change rate among one or more voltage change rates calculated before the current diagnosis cycle as the reference change rate.

For example, as in the previous embodiment, it is assumed that the control unit 120 calculates the first to fifth voltage change rates, and the fifth voltage change rate is calculated most recently. The control unit 120 may set the voltage change rate having the largest magnitude among the first to fourth voltage change rates excluding the fifth voltage change rate as the reference change rate. Hereinafter, it is assumed that the first voltage change rate is set as the reference change rate.

The control unit 120 may be configured to compare the magnitudes of the reference change rate and the voltage change rate, and diagnose the battery module BM according to the comparison result.

Specifically, when the voltage change rate is equal to or greater than the reference change rate, the control unit 120 may be configured to diagnose the battery module BM as a defective module. For example, when the fifth voltage change rate set as the voltage change rate is equal to or greater than the first voltage change rate set as the reference change rate, the state of the battery module BM may be diagnosed as a defective module.

Conversely, when the voltage change rate is less than the reference change rate, the control unit 120 may be configured to diagnose the battery module BM as a normal module. For example, when the fifth voltage change rate set as the voltage change rate is less than the first voltage change rate set as the reference change rate, the state of the battery module BM may be diagnosed as a normal module.

In an embodiment of the present disclosure, when the voltage change rate for the battery module BM increases, the control unit 120 may diagnose the battery module BM as a defective module. Here, the case where the voltage change rate increases may be a case where the voltage change amount (standard deviation or dispersion) for the plurality of battery cells B increases. For example, when the voltage deviation for the plurality of battery cells B is increased due to non-uniform degradation of the plurality of battery cells B, the voltage change rate of the battery module BM may be increased. Accordingly, the battery diagnosing apparatus may diagnose the battery module BM according to the result of comparing the voltage change rate and the reference change rate.

Meanwhile, the control unit 120 may be configured to diagnose each of the plurality of battery cells B based on a voltage value corresponding to each of the plurality of battery cells B, in parallel with diagnosing the battery module BM, at every the voltage measurement cycle.

Specifically, an upper limit voltage value and a lower limit voltage value for the voltage of the battery cell may be preset. The control unit 120 may diagnose a battery cell in which the voltage value received from the voltage measuring unit 110 is equal to or greater than the upper limit voltage value as an overvoltage state. Also, the control unit 120 may diagnose a battery cell in which the received voltage value is equal to or less than the lower limit voltage value as a low voltage state. The control unit 120 may diagnose a battery cell in which the voltage value is less than the upper limit voltage value and exceeds the lower limit voltage value as a normal state.

That is, the control unit 120 may diagnose the state of the battery module BM at every diagnosis cycle, and may also diagnose the state of each of the plurality of battery cells B at every voltage measurement cycle.

Accordingly, there is an advantage in that the state of each of the plurality of battery cells B and the state of the battery module BM may all be diagnosed by the battery diagnosing apparatus.

Hereinafter, an embodiment in which the control unit 120 adjusts a counting value and diagnoses the battery module BM according to the adjusted counting value will be described.

The control unit 120 may be configured to determine the state of the battery module BM based on at least one of the voltage change rate, the criterion change rate and the reference change rate at every the diagnosis cycle, and adjust a preset counting value according to the determined state of the battery module BM.

Here, the counting value may have an initial value and a minimum value set to 0. In addition, the counting value may be adjusted by increasing or decreasing by 1 by the control unit 120.

Specifically, when the battery module BM is diagnosed as a defective module by the control unit 120, the use of the battery module BM may be stopped and replacement may be requested. That is, when the battery module BM is diagnosed as a defective module, unlike the case where the battery module BM is diagnosed as a normal module, there may be a penalty for the corresponding battery module BM. Accordingly, the control unit 120 may be configured to conservatively diagnose the battery module BM as a defective state according to stricter standards.

For example, the control unit 120 may be configured to decrease the counting value, when the voltage change rate is less than the criterion change rate. In this case, the control unit 120 may diagnose the battery module BM as a normal module. If the existing counting value is 0, since the counting value cannot be decreased anymore (because the minimum value is set to 0), the counting value may be maintained at 0.

Also, the control unit 120 may be configured to decrease the counting value, when the voltage change rate is greater than or equal to the criterion change rate and less than the reference change rate. In this case, the control unit 120 may diagnose the battery module BM as a normal module.

In addition, the control unit 120 may be configured to increase the counting value, when the voltage change rate is equal to or greater than the criterion change rate and the reference change rate. In this case, the control unit 120 may be configured to diagnose the battery module BM based on the adjusted counting value and a preset criterion value without immediately diagnosing the battery module BM as a defective module.

Here, the criterion value is a preset value and may be set as a natural number.

Specifically, the control unit 120 may be configured to diagnose the battery module BM as the defective module, when the adjusted counting value is equal to or greater than the criterion value.

For example, when the voltage change rate is equal to or greater than the criterion change rate and the reference change rate, the counting value may be increased. In addition, if the adjusted counting value is equal to or greater than the criterion value, the battery module BM may be diagnosed as a defective module. That is, the control unit 120 may be configured to diagnose the battery module BM as a defective module, when the case where the voltage change rate is equal to or greater than the criterion change rate and the reference change rate occurs by the criterion value or more. Accordingly, since the control unit 120 diagnoses the battery module BM as a defective module through strict criteria, the possibility of erroneously diagnosing a normal module as a defective module may be significantly reduced.

However, when the voltage change rate is less than the criterion change rate or when the voltage change rate is equal to or greater than the criterion change rate but less than the reference change rate, the control unit 120 may reduce the counting value. That is, in this case, the adjusted counting value is inevitably less than the criterion value.

Accordingly, the control unit 120 may diagnose the battery module BM as a normal module even if the adjusted counting value and the criterion value are not compared, in order to prevent unnecessary waste of system resources by using system resources more efficiently.

The battery diagnosing apparatus 100 according to an embodiment of the present disclosure may diagnose the battery module BM as a defective module through strict criteria based on the counting value and the criterion value. Accordingly, the battery diagnosing apparatus may prevent a normal module from being erroneously diagnosed as a defective module.

The battery diagnosing apparatus 100 according to the present disclosure may be applied to a BMS (Battery Management System). That is, the BMS according to the present disclosure may include the battery diagnosing apparatus 100 described above. In this configuration, at least some components of the battery diagnosing apparatus 100 may be implemented by supplementing or adding functions of the configuration included in the conventional BMS. For example, the voltage measuring unit 110, the control unit 120 and the storage unit 130 of the battery diagnosing apparatus 100 may be implemented as components of the BMS.

In addition, the battery diagnosing apparatus 100 according to the present disclosure may be provided to a battery pack 1. For example, referring to FIG. 2, the battery pack 1 according to the present disclosure may include the battery diagnosing apparatus 100 and a battery module BM. In addition, the battery pack 1 may further include electrical equipment (a relay, a fuse, etc.) and a case.

Figure 3:
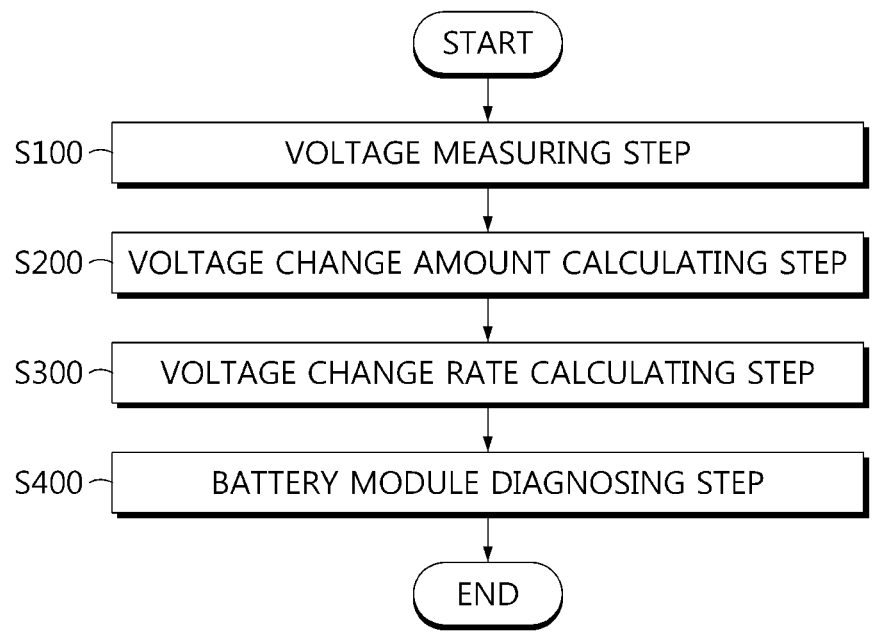
FIG. 3 is a diagram schematically showing a battery diagnosing method according to still another embodiment of the present disclosure.

FIG. 3 is a diagram schematically showing a battery diagnosing method according to still another embodiment of the present disclosure.

Preferably, each step of the battery diagnosing method may be performed by the battery diagnosing apparatus 100. Hereinafter, content overlapping with the previously described content will be omitted or briefly described.

Referring to FIG. 3, the battery diagnosing method may include a voltage measuring step (S100), a voltage change amount calculating step (S200), a voltage change rate calculating step (S300), and a battery module diagnosing step (S400).

The voltage measuring step S100 is a step of measuring a voltage of each of a plurality of battery cells B included in a battery module BM at every voltage measurement cycle, and may be performed by the voltage measuring unit 110.

The voltage change amount calculating step (S200) is a step of calculating a voltage change amount between the plurality of voltage values for the plurality of battery cells B at every voltage measurement cycle, and may be performed by the control unit 120.

The control unit 120 may receive the plurality of voltage values for the plurality of battery cells B from the voltage measuring unit 110 and calculate a voltage change amount between the plurality of received voltage values.

For example, the control unit 120 may calculate a voltage change amount by computing a dispersion or standard deviation between the plurality of voltage values.

The voltage change rate calculating step (S300) is a step of calculating a voltage change rate between the plurality of calculated voltage change amounts at every diagnosis cycle different from the voltage measurement cycle, and may be performed by the control unit 120.

It is assumed that the voltage measurement cycle is 1 second and the diagnosis cycle is 100 seconds. The control unit 120 may calculate a voltage change amount of the plurality of voltage values for the plurality of battery cells B measured at every 1 second. In addition, the control unit 120 may calculate a voltage change rate for the plurality of voltage change amounts at every 100 seconds. In this case, the control unit 120 may calculate a voltage change rate for 100 voltage change amounts at every 100 seconds.

For example, the control unit 120 may calculate the voltage change rate for the corresponding diagnosis cycle by computing an average change rate between the first calculated voltage change amount and the last calculated voltage change amount in the corresponding diagnosis cycle.

The battery module diagnosing step (S400) is a step of diagnosing the battery module BM based on one or more voltage change rates calculated up to the current diagnosis cycle and a preset criterion change rate, and may be performed by the control unit 120.

Figure 4:
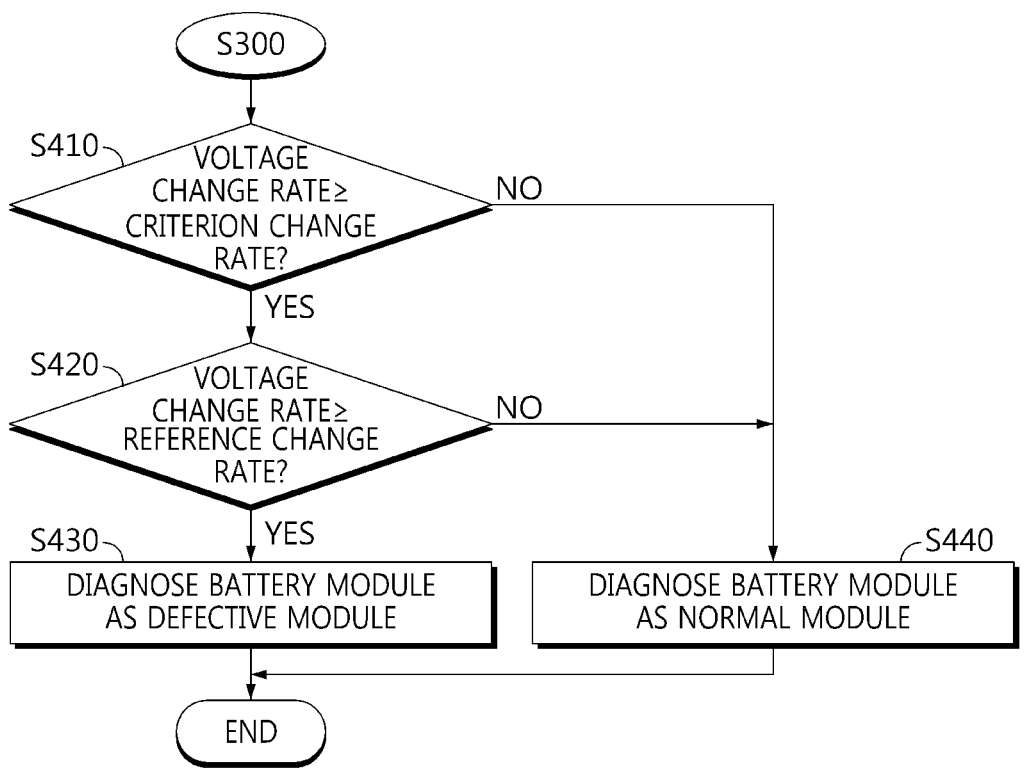
FIG. 4 is a diagram schematically showing an embodiment of a battery module diagnosing step in the battery diagnosing method according to still another embodiment of the present disclosure.

FIG. 4 is a diagram schematically showing an embodiment of the battery module diagnosing step (S400) in the battery diagnosing method according to still another embodiment of the present disclosure.

Referring to FIG. 4, the battery module diagnosing step (S400) may include Step S410 to Step S440.

In Step S410, the voltage change rate and the criterion change rate may be compared. Specifically, the magnitudes of the voltage change rate calculated at the current diagnosis cycle and the criterion change rate may be compared. If the voltage change rate is equal to or greater than the criterion change rate, Step S420 may be performed, and if the voltage change rate is less than the criterion change rate, Step S440 may be performed.

In Step S420, the voltage change rate and the reference change rate may be compared. Specifically, the magnitudes of the voltage change rate calculated at the current diagnosis cycle and the reference change rate preset before the current diagnosis cycle may be compared. That is, the magnitudes of the voltage change rate calculated at the current diagnosis cycle and the reference change rate having a largest magnitude among one or more voltage change rates calculated at the previous diagnosis cycle may be compared. If the voltage change rate is equal to or greater than the reference change rate, Step S430 may be performed, and if the voltage change rate is less than the criterion change rate, Step S440 may be performed.

In Step S430, the battery module BM may be diagnosed as a defective module. That is, if the voltage change rate is equal to or greater than the criterion change rate and the reference change rate, the control unit 120 may diagnose the battery module BM as a defective module.

In Step S440, the battery module BM may be diagnosed as a normal module. That is, if the voltage change rate is less than the criterion change rate, or if the voltage change rate is equal to or greater than the criterion change rate but less than the reference change rate, the control unit 120 may diagnose the battery module BM as a normal module.

Figure 5:
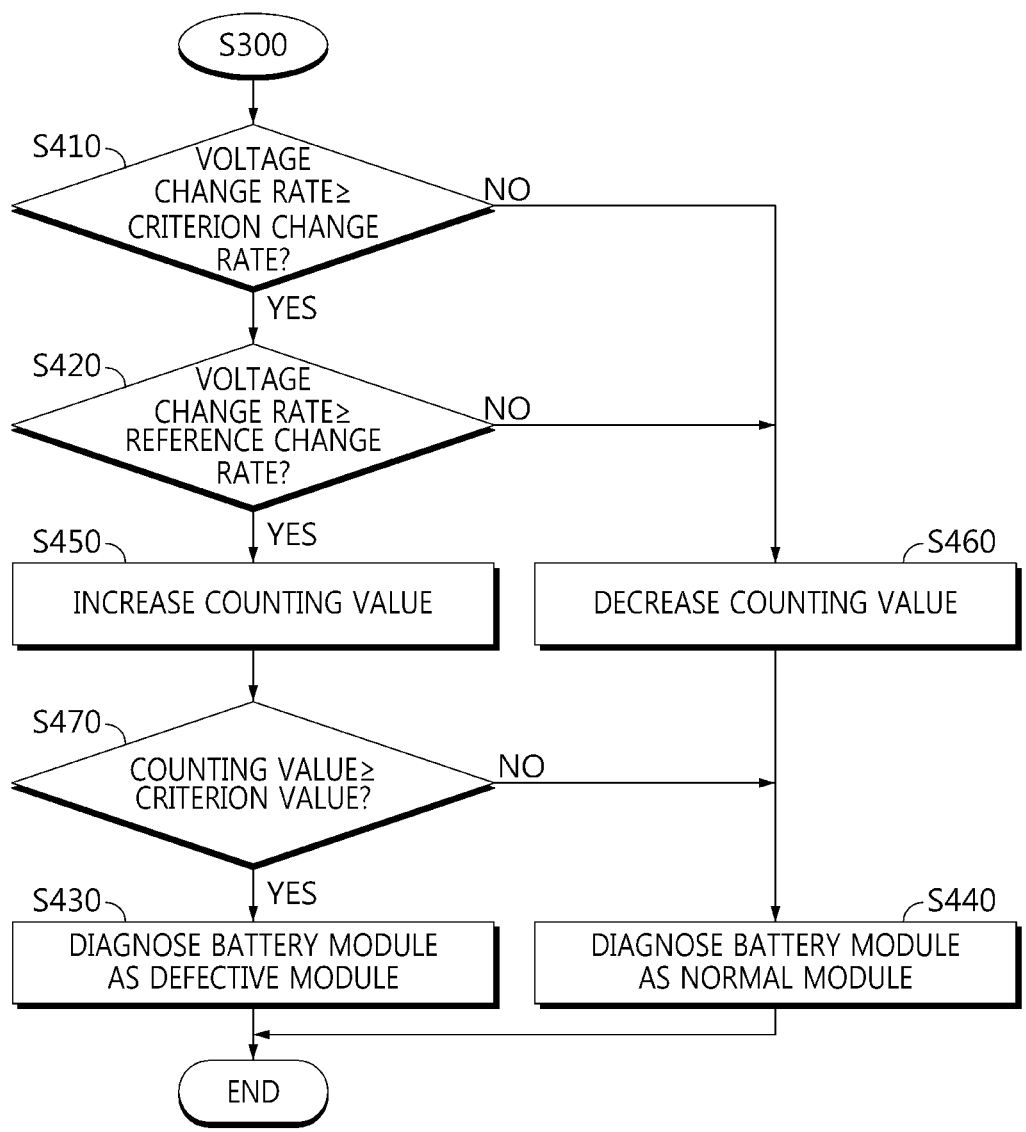
FIG. 5 is a diagram schematically showing another embodiment of the battery module diagnosing step in the battery diagnosing method according to still another embodiment of the present disclosure.

FIG. 5 is a diagram schematically showing another embodiment of the battery module diagnosing step (S400) in the battery diagnosing method according to still another embodiment of the present disclosure.

Referring to FIG. 5, the battery module diagnosing step (S400) may include Step S410 to Step S470. Hereinafter, the embodiment of FIG. 5 will be described with a focus on the difference from the embodiment of FIG. 4.

In Step S410, if the voltage change rate is greater than or equal to the criterion change rate, Step S420 may be performed, and if the voltage change rate is less than the criterion change rate, Step S460 may be performed.

In Step S420, if the voltage change rate is equal to or greater than the reference change rate, Step S450 may be performed, and if the voltage change rate is less than the reference change rate, Step S460 may be performed.

In Step S450, the counting value may be increased. For example, the counting value may have an initial value and a minimum value set to 0, and may be increased by 1. That is, if the voltage change rate is equal to or greater than the criterion change rate and the reference change rate, the control unit 120 may increase the counting value. After the counting value is increased, Step S470 may be performed.

In Step S470, the counting value and the criterion value may be compared. Specifically, if the counting value increased in Step S450 is greater than or equal to the criterion value, Step S430 may be performed. Conversely, if the counting value increased in Step S450 is less than the criterion value, Step S440 may be performed.

In Step S460, the counting value may be decreased. That is, if the voltage change rate is less than the criterion change rate, or if the voltage change rate is equal to or greater than the criterion change rate but less than the reference change rate, the control unit 120 may decrease the counting value. However, the counting value may not decrease below the set minimum value. After Step S460, Step S440 may be performed so that the battery module BM may be diagnosed as a normal module.

The embodiments of the present disclosure described above may not be implemented only through an apparatus and a method, but may be implemented through a program that realizes a function corresponding to the configuration of the embodiments of the present disclosure or a recording medium on which the program is recorded. The program or recording medium may be easily implemented by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

REFERENCE SIGNS

1: battery pack
100: battery diagnosing apparatus
110: voltage measuring unit
120: control unit
130: storage unit
BM: battery module
C: plurality of battery cells

What is claimed is:

1. A battery diagnosing apparatus, comprising:
a voltage sensor configured to measure a voltage of each of a plurality of battery cells included in a battery module at each voltage measurement cycle of a plurality of diagnosis cycles, wherein each diagnosis cycle includes a respective plurality of voltage measurement cycles that do not overlap with the respective plurality of voltage measurement cycles of the other diagnosis cycles of the plurality of diagnosis cycles;
a controller; and
memory having instructions stored thereon and configured to cause the controller to:
at each respective voltage measurement cycle, obtain measured voltages of the plurality of battery cells from the voltage sensor;
at each respective diagnosis cycle, calculate a voltage change amount based on the measured voltages of the plurality of voltage measurement cycles of the respective diagnosis cycle;
at each respective diagnosis cycle, calculate a voltage change rate indicating a difference between a first calculated voltage change amount of the respective diagnosis cycle and a last calculated voltage change amount of the respective diagnosis cycle; and
diagnose the battery module based on one or more calculated voltage change rates and a preset threshold change rate.

2. The battery diagnosing apparatus according to claim 1, wherein the instructions are configured to cause the controller to:
compare a magnitude of the voltage change rate calculated at a current diagnosis cycle and a magnitude of the threshold change rate; and
determine a state of the battery module based on the comparison.

3. The battery diagnosing apparatus according to claim 1, wherein the instructions are configured to cause the controller to, for each respective diagnosis cycle, calculate the voltage change amount of the respective diagnosis cycle by computing a standard deviation or dispersion of the plurality of measured voltage values of the respective diagnosis cycle.

4. The battery diagnosing apparatus according to claim 1, wherein the instructions are configured to cause the controller to individually diagnose each respective battery cell of the plurality of battery cells based on the measured voltage values corresponding to the respective battery cell.

5. A battery pack, comprising the battery diagnosing apparatus according to claim 1.

6. A battery diagnosing apparatus, comprising:
a voltage sensor configured to measure a voltage of each of a plurality of battery cells included in a battery module at each voltage measurement cycle of a plurality of diagnosis cycles, wherein each diagnosis cycle includes a respective plurality of voltage measurement cycles that do not overlap with the respective plurality of voltage measurement cycles of the other diagnosis cycles of the plurality of diagnosis cycles;
a controller; and
memory having instructions stored thereon and configured to cause the controller to:
at each respective voltage measurement cycle, obtain measured voltages of the plurality of battery cells from the voltage sensor;
at each respective diagnosis cycle, calculate a voltage change amount based on the measured voltages of the plurality of voltage measurement cycles of the respective diagnosis cycle;
at each respective diagnosis cycle, calculate a voltage change rate indicating a difference between a first calculated voltage change amount of the respective diagnosis cycle and a last calculated voltage change amount of the respective diagnosis cycle; and diagnose the battery module based on one or more calculated voltage change rates and a preset threshold change rate wherein the instructions are configured to cause the controller to:

compare a magnitude of the voltage change rate calculated at a current diagnosis cycle and a magnitude of the threshold change rate; and determine a state of the battery module based on the comparison; and wherein the instructions are configured to cause the controller to, at a current diagnosis cycle:

determine the state of the battery module based on a reference change rate preset at a previous diagnosis cycle and the voltage change rate of the current diagnosis cyclein response to the voltage change rate of the current diagnosis cycle being equal to or greater than the threshold change rate; and determine that the battery module is normal in response to the voltage change rate of the current diagnosis cycle being less than the threshold change rate.

7. The battery diagnosing apparatus according to claim 6, wherein the reference change rate is a largest voltage change rate among one or more voltage change rates calculated at one or more diagnosis cycles previous to the current diagnosis cycle.

8. The battery diagnosing apparatus according to claim 6, wherein the instructions are configured to cause the controller to, at the current diagnosis cycle, determine that the battery module is defective in response to the voltage change rate being equal to or greater than the threshold change rate and the reference change rate.

9. The battery diagnosing apparatus according to claim 8, wherein the instructions are configured to cause the controller to:

determine the state of the battery module at every diagnosis cycle;

adjust a preset counting value according to the determined state of the battery module; and diagnose the battery module based on the adjusted counting value and a preset threshold value.

10. The battery diagnosing apparatus according to claim 9, wherein the instructions are configured to cause the controller to determine that the battery module is defective in response to the adjusted counting value being equal to or greater than the threshold value.

11. The battery diagnosing apparatus according to claim 9, wherein the instructions are configured to cause the controller to:

decrease the counting value in response to the voltage change rate being less than the reference change rate; and increase the counting value in response to the voltage change rate being equal to or greater than the reference change rate.

12. A battery diagnosing method, comprising:

measuring, by a voltage sensor, a voltage of each of a plurality of battery cells included in a battery module at each voltage measurement cycle of a plurality of diagnosis cycles, wherein each diagnosis cycle includes a respective plurality of voltage measurement cycles that do not overlap with the respective plurality of voltage measurement cycles of the other diagnosis cycles of the plurality of diagnosis cycles;

at each respective voltage measurement cycle, obtaining, by a controller, measured voltages of the plurality of battery cells from the voltage sensor;

at each respective diagnosis cycle, calculating, by a controller, a voltage change amount based on the measured voltages of the plurality of voltage measurement cycles of the respective diagnosis cycle;

at each respective diagnosis cycle, calculating, by the controller, a voltage change rate indicating a difference between a first calculated voltage change amount of the respective diagnosis cycle and a last calculated voltage change amount of the respective diagnosis cycle; and diagnosing, by the controller, the battery module based on one or more calculated voltage change rates and a preset threshold change rate.

* * * * *